United States Patent
Vanderberg et al.

(10) Patent No.: US 11,114,270 B2
(45) Date of Patent: Sep. 7, 2021

(54) SCANNING MAGNET DESIGN WITH ENHANCED EFFICIENCY

(71) Applicant: Axcelis Technologies, Inc., Beverly, MA (US)

(72) Inventors: Bo Vanderberg, Gloucester, MA (US); Edward Eisner, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 10 days.

(21) Appl. No.: 16/106,745

(22) Filed: Aug. 21, 2018

(65) Prior Publication Data

US 2020/0066478 A1  Feb. 27, 2020

(51) Int. Cl.
| | |
|---|---|
| *H01J 37/147* | (2006.01) |
| *H01F 7/20* | (2006.01) |
| *H01J 37/317* | (2006.01) |
| *H01F 3/02* | (2006.01) |
| *H01F 27/28* | (2006.01) |

(52) U.S. Cl.
CPC ............ *H01J 37/1475* (2013.01); *H01F 3/02* (2013.01); *H01F 7/20* (2013.01); *H01F 7/202* (2013.01); *H01F 27/2823* (2013.01); *H01J 37/3171* (2013.01); *H01J 2237/05* (2013.01); *H01J 2237/057* (2013.01); *H01J 2237/1415* (2013.01); *H01J 2237/152* (2013.01)

(58) Field of Classification Search
CPC ............ H01J 37/1475; H01J 2237/152; H01J 2237/1405; H01J 2237/1415; H01J 37/3171; H01J 2237/05; H01F 7/20
See application file for complete search history.

(56) References Cited

U.S. PATENT DOCUMENTS

| | | | |
|---|---|---|---|
| 5,311,028 A | 5/1994 | Glavish | |
| 5,393,984 A | 2/1995 | Glavish | |
| 2003/0025085 A1* | 2/2003 | Nakano | H01J 37/1475 250/396 ML |
| 2009/0206270 A1* | 8/2009 | Glayish | H01J 37/3171 250/396 ML |
| 2010/0084576 A1 | 4/2010 | Vanderberg | |
| 2011/0114851 A1* | 5/2011 | Purser | H01J 37/3171 250/396 R |

(Continued)

OTHER PUBLICATIONS

Enge, Harald; "Optics of Deflecting Magnets"; Industrial Coils, Inc. Middleton, Massachusetts.

(Continued)

*Primary Examiner* — Brooke Purinton
(74) *Attorney, Agent, or Firm* — Eschweiler & Potashnik, LLC

(57) ABSTRACT

A scanning magnet is positioned downstream of a mass resolving magnet of an ion implantation system and is configured to control a path of an ion beam downstream of the mass resolving magnet for a scanning or dithering of the ion beam. The scanning magnet has a yoke having a channel defined therein. The yoke is ferrous and has a first side and a second side defining a respective entrance and exit of the ion beam. The yoke has a plurality of laminations stacked from the first side to the second side, wherein at least a portion of the plurality of laminations associated with the first side and second side comprise one or more slotted laminations having plurality of slots defined therein.

20 Claims, 7 Drawing Sheets

(56) References Cited

U.S. PATENT DOCUMENTS

2017/0076908 A1* 3/2017 Buff .................... H01J 37/1475
2017/0372867 A1* 12/2017 Caspi .................. H01J 37/1475
2018/0315578 A1* 11/2018 Rand ....................... H01J 37/08

OTHER PUBLICATIONS

Enge, Harald; "Quadrupole Engineering Data"; Industrial Coils, Inc. Middleton, Massachusetts.
Liu, Xu et al; "Eddy Current Analysis and Optimization of Fast Scanning Magnet for a Proton Therapy System"; Nuclear Instruments & Methods in Physics Research; vol. 862; May 8, 2017.
Liu, Xu et al; "Design of the Fast Scanning Magnets for HUST Proton Therapy Facility"; 21st International Conference on Cyclotrons and Their Applications; Zurich, Switzerland, Jan. 1, 2017.
International Search Report and Written Opinion dated Nov. 8, 2019 in connection with International Application No. PCT/US2019/047407.

* cited by examiner

SCANNING MAGNET DESIGN WITH ENHANCED EFFICIENCY

FIELD

The present disclosure relates generally to ion implantation systems and more specifically to a scanning apparatus having scanning magnet components configured to provide increased efficiency of scanning of an ion beam.

BACKGROUND

In the manufacture of semiconductor devices and in other ion implantation processing, ion implantation systems are used to impart ions into semiconductor wafers, display panels, or other types of workpieces. For semiconductors, typical ion implantation systems or ion implanters impact a workpiece with an ion beam utilizing a known recipe or process in order to produce n-type or p-type doped regions, or modify other bulk properties such as forming passivation layers in the workpiece.

Typically, dopant atoms or molecules are ionized and isolated, sometimes accelerated or decelerated, formed into a beam, and implanted into a workpiece. The dopant ions physically bombard and enter the surface of the workpiece, and subsequently come to rest below the workpiece surface in the crystalline lattice structure thereof. A typical ion implanter comprises an ion source for generating the ion beam, a beamline assembly having a mass analysis apparatus for directing and/or filtering (e.g., mass resolving) ions within the beam, and a target chamber containing one or more wafers or workpieces to be treated.

Various types of ion implanters allow respectively varied dosages and energies of ions to be implanted, based on the desired characteristics to be achieved within the workpiece. For example, high-current ion implanters are typically used for high dose implants, and medium-current to low-current ion implanters are utilized for lower dose applications. An energy of the ions can further vary, wherein the energy generally determines the depth to which the ions are implanted within the workpiece, such as to control junction depths in semiconductor devices. Typically, high- to medium-energy implanters have a substantial length of travel of the ion beam (also called the beamline of the implanter) before it impacts the workpiece. Low-energy implanters, however, typically have a much shorter beamline due, at least in part, to the low energies associated with the ion beam, wherein the low-energy ion beams tend to lose transmission with longer beamlines.

The ion beam can be stationary in so-called "2-D mechanical scan" systems, wherein the workpiece is mechanically scanned in two dimensions through the stationary beam during implantation. Such a scanning of the workpiece often has a complex architecture for uniformly translating the workpiece through the stationary ion beam. One alternative to a 2-D mechanical scan system is to scan or dither the ion beam with respect to a stationary workpiece, wherein electrical deflecting plates or an electromagnet alter the path of the ion beam in a controlled manner, in a so-called "2-D scan system". However, such a scanning apparatus often inhabits a significant portion of real estate along the beamline. Furthermore, in the case of a 2-D scan system, there is often a greater need to focus the ion beam to provide optimal scanning of the beam. However, the implementation of such focusing optics is conventionally limited due to the ion beam moving with respect to the focusing optics, rendering implementation of ion beam focusing difficult.

A so-called "hybrid scan" ion implantation system, on the other hand, translates a workpiece through a scanned ion beam, sometimes referred to as a scanned ribbon, or simply a ribbon beam. Scanning of the ion beam is usually performed by deflecting a spot or pencil ion beam with a scanning element. The scanning element can be electric or magnetic, exposing the ion beam to electric or magnetic forces that change the direction of motion of the ions and effectively spread the spot beam into a scanned ribbon beam that can be parallelized with subsequent beamline optics.

In contrast to electric scanning plates, magnetic scanning of ion beams is advantageous in high current ion implanters, since the magnetic field in scan magnets does not strip the ion beam of a self-neutralizing beam plasma present in the high current ion beam. High current implanters have large acceptances, and as such, the scanners are quite large. Further, since the power requirement of scanners increases with scanner size, power requirements for magnetic scan magnets can be high.

SUMMARY

The present disclosure overcomes various limitations of the prior art by providing a magnetic scanners for an ion implantation system, wherein size and efficiency of the magnetic scanner is advantageously improved. The present disclosure thus advantageously reduces power requirements and operating costs by providing a more efficient scanning magnet. Accordingly, the following presents a simplified summary of the disclosure in order to provide a basic understanding of some aspects of the disclosure. This summary is not an extensive overview of the invention. It is intended to neither identify key or critical elements of the invention nor delineate the scope of the invention. Its purpose is to present some concepts of the disclosure in a simplified form as a prelude to the more detailed description that is presented later.

The present disclosure is generally directed to ion implantation systems and more particularly to an improved scanning magnet for scanning an ion beam in vacuum. In accordance with the disclosure, an ion implantation system is provided, wherein the ion implantation system comprises an ion source configured to generate a beam of ions. The ion source, for example, may be configured to generate a spot ion beam or a static ribbon beam. The ion implantation system further comprises a mass analyzer or mass resolving magnet configured to mass resolve the beam of ions. A mass resolving aperture is further positioned downstream of the mass analyzer, wherein the mass resolving aperture is configured to filter undesirable species from the ion beam.

According to one exemplary aspect of the disclosure, a scanning magnet is positioned downstream of the mass resolving or analyzing magnet, although in some alternate configurations, scanning magnets can also be positioned prior to the mass analyzing magnet. In this example, the scanning magnet is configured to control a path of the pencil or "spot" ion beam downstream of the mass resolving magnet for a scanning or dithering of the ion beam. According to one example, the scanning magnet comprises a yoke having a channel defined therein. The yoke, for example, is ferrous and has a first side and a second side defining a respective entrance and exit of the ion beam. The yoke comprises a plurality of laminations stacked from the first side to the second side, wherein at least a portion of the plurality of laminations associated with the first side and second side comprise one or more slotted laminations having a plurality of slots defined therein. Furthermore, a scanner coil is provided, wherein the scanner coil comprises at least a first wire which is wrapped around the yoke.

According to one example, the yoke comprises a first half and second half, wherein the first half and second half are generally mirror images of one another. In another example, at least a portion of the plurality of laminations are associated with one or more pole edges of the yoke. For example, a predetermined portion of the plurality of laminations associated with the one or more pole edges comprise the one or more slotted laminations, wherein the remaining of the plurality of laminations comprise a substantially planar lamination having a planar region associated with the plurality of slots, and wherein the planar region comprises no slots. In another example, the one or more slotted laminations associated with the one or more pole edges generally reduce a length of a portion of the plurality of laminations in a direction transverse to a flux associated with operation of the scanning magnet.

In another example, the plurality of slots have a slot length configured to guide the flux from the yoke to a pole gap, while minimizing eddy currents within the plurality of laminations, thereby not causing excessive heating of the yoke. The plurality laminations, for example, are slotted to resemble comb-like structures. In yet another example, magnetic flux exiting the yoke is guided into a field clamp, whereby the field clamp is further comprises field clamp laminations, some of which may be slotted.

In yet another example, one or more liners (e.g., one or more graphite liner members) generally line an interior region of the pole gap, whereby the one or more liners generally protect the scanning magnet from direct ion beam strike. The one or more liners, for example, comprise one or more liner slots defined therein, whereby the one or more liner slots are configured to generally reduce eddy currents within the one or more liners, thus minimizing losses and diamagnetic effects.

To the accomplishment of the foregoing and related ends, the disclosure comprises the features hereinafter fully described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
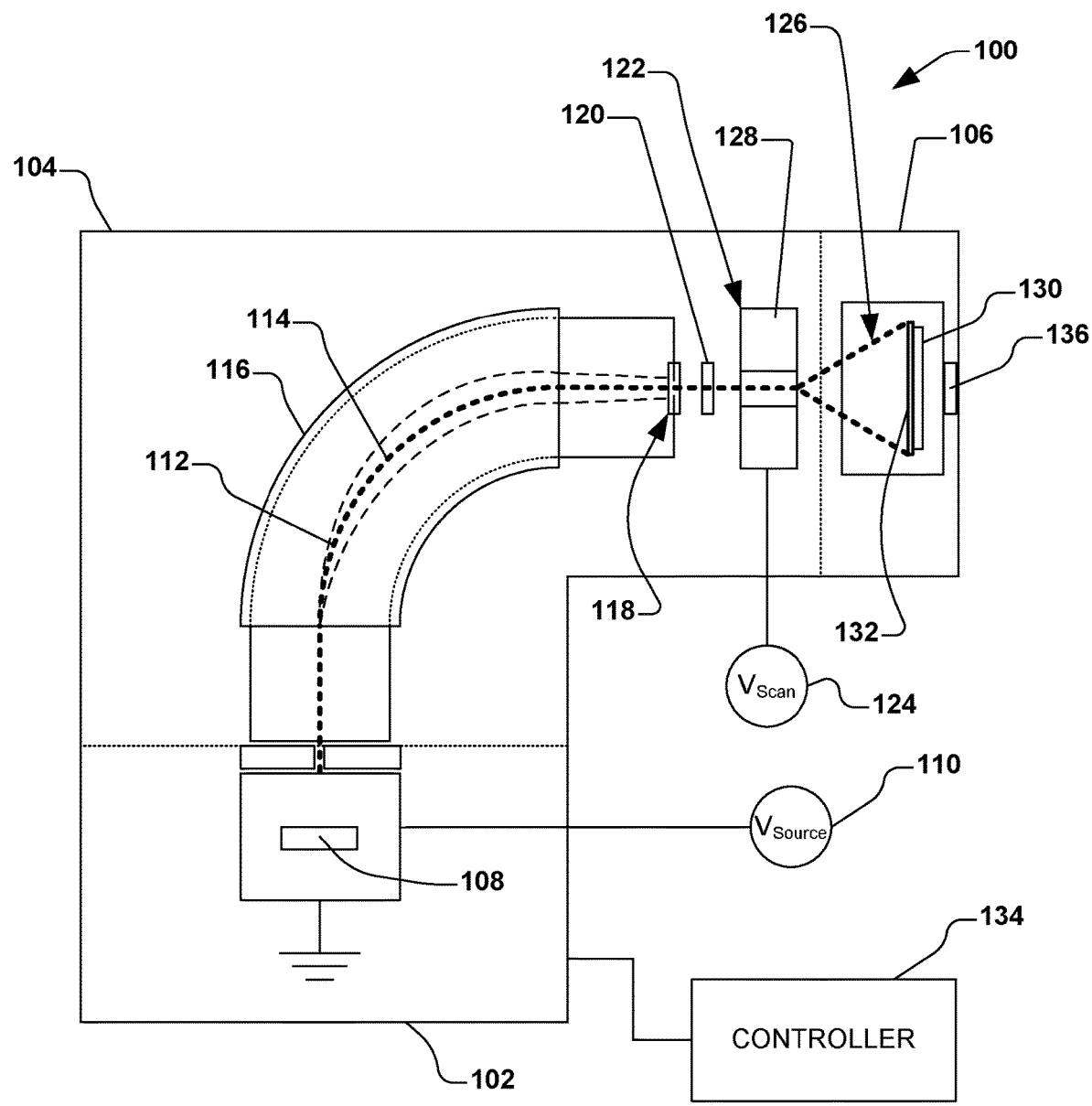
FIG. 1 illustrates an exemplary ion implantation system in accordance with various aspects of the present disclosure.

The present disclosure is directed generally to ion implantation and scanning of an ion beam. More particularly, an improved scanning magnet is provided for increasing an efficiency of scanning of the ion beam. Accordingly, the present disclosure will now be described with reference to the drawings, wherein like reference numerals are used to refer to like elements throughout. It should be understood that the description of these aspects is merely illustrative and should not be taken in a limiting sense. In the following description, for purposes of explanation, numerous specific details are set forth in order to provide a thorough understanding of the present disclosure. It will be evident to one skilled in the art, however, that the present disclosure may be practiced without these specific details.

Referring now to the Figures, in order to gain a better understanding of the disclosure, exemplary ion implantation system 100 is schematically illustrated in FIG. 1, wherein the exemplary ion implantation system is suitable for implementing one or more aspects of the present disclosure. It should be noted that although the ion implantation system 100 is illustrated as one example, the present disclosure can be practiced using various other types of ion implantation apparatus and systems, such as high energy systems, high current systems, or other implantation systems, and all such systems are contemplated as falling within the scope of the present disclosure.

The ion implantation system 100 (also called an ion implanter) illustrated in FIG. 1 comprises a terminal 102, a beamline assembly 104, and an end station 106, wherein the terminal comprises an ion source 108 powered by a high voltage power supply 110. The ion source 108 is thus operable to produce an ion beam 112, and to direct the ion beam to the beamline assembly 104. The ion source 108, for example, generates charged ions that are extracted and formed into the ion beam 112, wherein the ion beam is directed along a nominal beam path 114 within the beamline assembly 104 and toward the end station 106. It should be noted that the ion beam 112 can have a relatively narrow profile (e.g., a generally circular cross-section when viewed from along the nominal beam path 114), hereinafter alternatively referred to as a "pencil" or "spot" ion beam, or an elongate profile (e.g., a generally elliptical cross-section when viewed from along the nominal beam path), hereinafter alternatively referred to as a "ribbon" ion beam.

It will be appreciated that since the ion beam 112 comprises like-charged particles, the ion beam may have a tendency to "blow-up" or expand radially outward as the like charged particles repel one another. It will be further appreciated that blow-up of the ion beam 112 can be exacerbated in low-energy, high-current ion beams, (e.g., ion beams that would be understood by one of ordinary skill in the art to possess high-perveance), wherein many like-charged particles are moving in the same direction relatively slowly. As such, an abundance of repulsive forces exists among the particles with little particle momentum to maintain the particles moving in the direction of the nominal beam path 114.

In accordance with another aspect of the disclosure, the beamline assembly 104 comprises a mass analyzer 116 (also called a mass resolving magnet). The mass analyzer 116, in the present example, is generally formed at about a ninety degree angle and comprises one or more magnets (not shown), wherein the one or more magnets generally establish a dipole magnetic field within the mass analyzer. As the ion beam 112 enters the mass analyzer 116, it is correspondingly bent via the magnetic field such that ions of an inappropriate charge-to-mass ratio are generally rejected. More particularly, ions having too great or too small a charge-to-mass ratio are deflected into side walls of the mass analyzer 116. In this manner, the mass analyzer 116 primarily allows only those ions in the ion beam 112 which have the desired charge-to-mass ratio to pass therethrough, wherein the ion beam exits the mass analyzer through a mass resolving aperture 118. The mass resolving aperture 118, for example, is further configured to filter undesirable species from the ion beam 112.

The ion beam 112, for example, generally diverges after passing through the mass resolving aperture 118. Accordingly, downstream of the mass analyzer 116, a focusing and/or steering element 120 may be further provided, wherein the focusing and steering element is configured to receive the mass analyzed ion beam 112 and to selectively focus and steer the ion beam. The focusing and/or steering element 120, for example, may comprise dipole or other multi-pole magnets (not shown) and the like, and can be designed with focusing properties in both dimensions transverse to the propagation direction of the ion beam 112, wherein this focusing can counteract the expansion of the beam size, thus providing good transmission of the ion beam through restrictions in the beam line, such as vacuum enclosures, apertures, etc.

In accordance with the present disclosure, a scanning magnet 122 is further positioned downstream of the mass analyzer 116. For example, an electric current waveform may be selectively applied to the scanning magnet 122 via a power supply 124, wherein the applied current waveform is operable to magnetically scan the ion beam 112 back and forth over time, thus "spreading out" the ion beam along a single beam scan plane (e.g., along the X-axis) and defining a scanned ion beam 126, wherein the scanned ion beam can be seen as an elongate beam when time-averaged over a cycle of the applied current waveform. The scanning of the ion beam 112 is accomplished by passing electrical current through one or more scanning wires (not shown) that are wrapped around a laminated ferrous yoke 128, as will be discussed in greater detail, infra.

The end station 106 is positioned downstream of the scanning magnet 122, wherein the end station comprises a workpiece support 130, upon which the one or more workpieces 132, such as silicon wafers, are positioned or mounted. The workpiece support 130, in one example, resides in a target plane which is generally perpendicularly oriented to the direction of the ion beam 112. Alternatively, the wafer support 130 may be oriented at angles substantially different from that shown and described. The workpiece support 130, for example, is generally stationary. In one alternative example, the workpiece support 130 may further take the form of a mechanical arm or a rotating disk capable of moving the workpiece through the ion beam 112.

A system controller 134, which may include a computer, microprocessor, or other control system, is further provided, wherein the controller is operable to control one or more of the terminal 102, beamline assembly 104, and the scanning magnet 122. Accordingly, the ion implantation system 100 can be adjusted via the system controller 134 in order to facilitate desired ion implantation based upon a desired dosage, current, and/or energy of ion implantation, as well as based on the one or more measured characteristics such as provided by a dosimetry system 136.

Scanning magnets for conventional ion implantation systems are manufactured using laminated silicon steel cores. When guiding magnetic flux through conventional laminated steel cores, much care is usually taken choosing the proper laminations and orientation thereof to enhance efficiency. A conventional laminated steel core, for example, is provided in U.S. Pat. Nos. 5,393,984 and 5,311,028 to Glavish. Correct orientation, for example, implies that magnetic field lines run parallel to the lamination surface, such that induced currents are minimized. This is accomplished within the limitations of laminated core technology, however, where flat, thin laminates are assembled as stacked layers. It is advantageous, for example, to construct a yoke and pole such that the laminations have the same shape, such that the laminations, for example, can be stamped from thin Si-steel sheets via a single tool. As such, conventional laminations cannot be easily oriented in arbitrary directions, as the stacking dictates one preferred, common lamination direction.

It is also generally difficult to post-machine the stacked lamination assembly, since the lamination thickness is relatively small and machining of stacked laminations can deleteriously alter the shape of the laminations. Further, machining of the laminations can also cause short-circuiting of laminations to each other via unintended transitioning of lamination material to being between the laminations. While various techniques to machine laminations exist, such techniques are typically expensive and rarely commercially desirable.

When magnetic flux exits a laminated pole piece in the center of a pole gap, for example, the direction of the flux or magnetic field does not generally change, since boundary conditions of Maxwell's equations prescribe that the tangential components of the magnetic fields on either side of the boundary are continuous. At the edge of a pole, however, the direction of the flux can change, for example, based on the shape of the pole, since the majority of the flux passes through the low reluctance pole, but a smaller fraction of the flux passes along a high reluctance path in the volume outside of the pole. More specifically, as illustrated in an exemplary scanning magnet 200 of FIG. 2A, fields 202 at the entrance 204 and exit 206 tend to be directed out of a yoke 208 of the scanning magnet, and meet the pole surface at a right angle, i.e. $H_t \approx 0$. At the corner of a pole, however, the fields are generally not perpendicular to the pole surface. An enlargement 210 of the exit 206 of the yoke 208 of FIG. 2A is illustrated in FIG. 2B, wherein the field 202 at the exit is in a direction more perpendicular (e.g., field line 202A) to the shape of the yoke than the field that is substantially tangential (e.g., field line 202C) to a lamination surface 212 of laminations 214 of the scanning magnet 200.

Figure 2A:
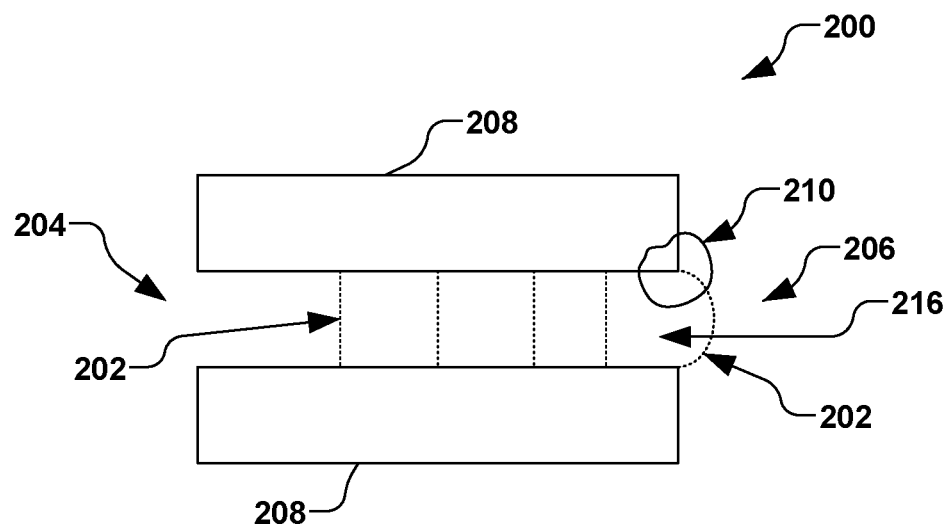
FIG. 2A illustrates an exemplary scanning magnet in accordance with one or more aspects of the disclosure.
Figure 2B:
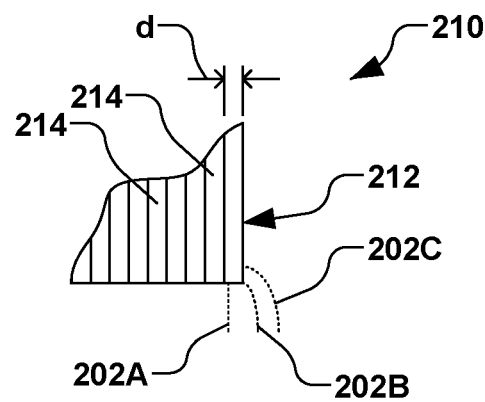
FIG. 2B is a blown-up portion of the scanning magnet of FIG. 2A illustrating further aspects of the disclosure.

When the scanning magnet 200 of FIG. 2A is energized, for example, currents are induced in the yoke 208 via Faraday's Law, where a time-dependent magnetic field would induce a time-dependent voltage inside any loop within the laminations 214 of FIG. 2B. Since the laminations 214 are electrically conductive, the current flowing inside the laminations tends to create a counter-magnetic field to cancel loop voltage, and is thus called diamagnetic current. Diamagnetic current flows in a direction normal to the magnetic field lines, and as such, the laminations 214 are oriented with the lamination surfaces 212 parallel to the magnetic field. Moreover, a strength of time-varying electromagnetic fields inside conductive media decays exponentially from the surface, and conductive media are conventionally characterized by a "skin depth" δ, where δ is equal to the depth at which the electromagnetic field has reached 1/e of the field strength at the surface of the medium. With an orientation of the laminations 214 with the lamination surfaces 212 oriented parallel to the magnetic field, the effective area or cross-section of the laminations 214 to permit the flow of current is generally minimized, and is typically on the order of the skin depth of the magnetic field in the conductor. If the thickness of the lamination 214 is of the order of the skin depth δ, diamagnetic current is effectively minimized to permit the induction of the magnetic field in a pole gap 216 through the magnetic yoke 208 of FIG. 2A.

Induced currents in the laminations 214, for example, are larger when the angle between the tangential field (e.g., field line 202C of FIG. 2B) and perpendicular field (e.g., field line 202A) of the laminations is significant. If diamagnetic currents are permitted to flow, the net flux in the scanning magnet 200 is reduced. Furthermore, since the lamination material has finite resistance, such induced currents, for example, can cause resistive heating of the yoke 208.

Figure 3:
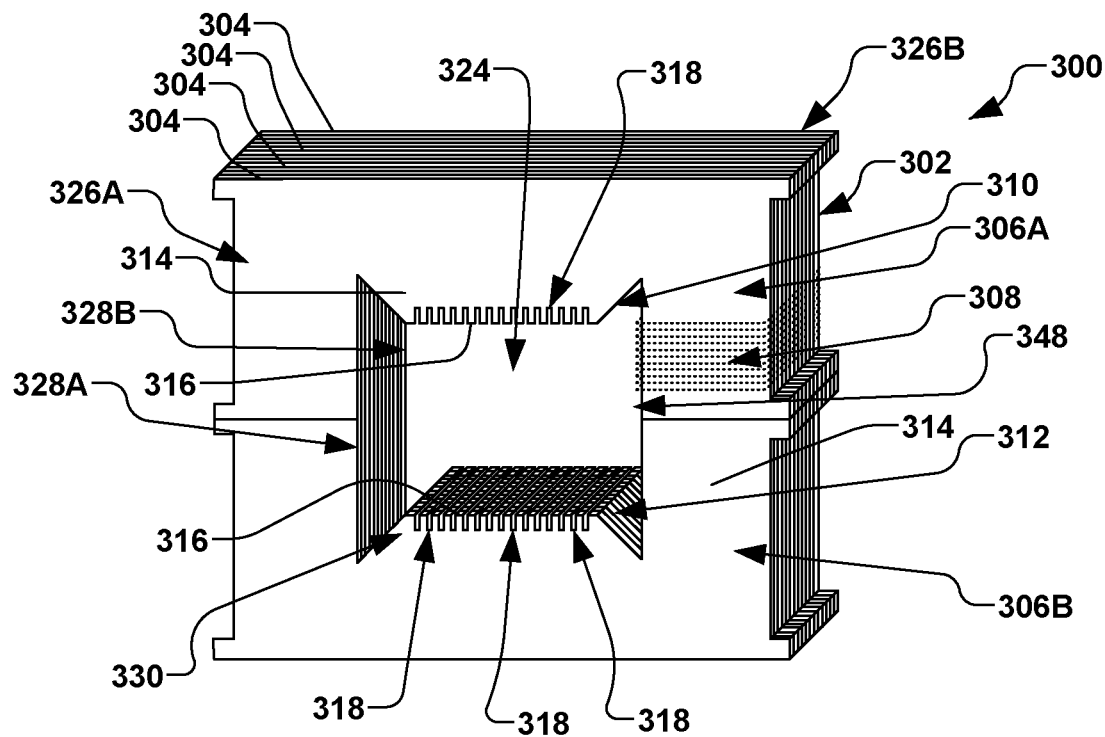
FIG. 3 is a perspective view of an exemplary yoke of a scanning magnet in accordance with various examples of the present disclosure.

Accordingly, in order mitigate excessive heating, the present disclosure provides a scanning magnet 300 illustrated in FIG. 3, wherein the scanning magnet comprises a yoke 302 having a plurality of laminations 304 (e.g., any number n of laminations, where n is a positive integer greater than one). The number n of laminations 304 may be selected based on desired characteristics of the scanning magnet 300, and the present example is not to be considered as a limiting example.

It is noted that in the present example, the yoke 302 comprises a first half 306A and second half 306B that are generally mirror images of one another, as will be understood by one of ordinary skill. Furthermore, while not shown entirely for purposes of clarity, one or more scanner coils or wires 308 may be wrapped around various portions of the yoke 302 and may be of any shape and be designed based on various design criteria. For example, the scanner coils 308 may comprise simple coils (shown schematically in FIG. 3 as dotted lines for clarity) wrapped around one or more portions of the yoke 302, or may alternatively or additionally comprise bedstead coils or other coils (not shown), as will be appreciated by one of skill in the art. The scanning magnet 300, for example, may be in vacuum or in air. However, the present disclosure is particularly beneficial when the scanning magnet 300 is in vacuo, as the present disclosure minimizes heat build-up in the yoke 302, where heat is particularly difficult to conduct and cool in a vacuum.

In one example, at least a portion 310 of the plurality of laminations 304 are associated with pole edges 312 (e.g., the entrance 204 and exit 206 of FIG. 2A) of the yoke 302 of FIG. 3 and comprise a slotted lamination 314, wherein the slotted lamination comprises a plurality of tines 316 generally defining a plurality of slots 318 therebetween.

Figure 4:
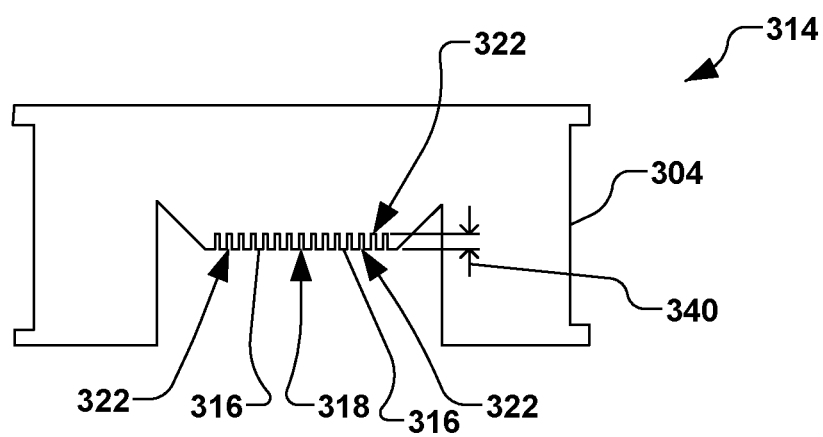
FIG. 4 is a plan view of a half of a slotted lamination of a scanning magnet yoke in accordance with further exemplary aspects of the disclosure.
Figure 5:
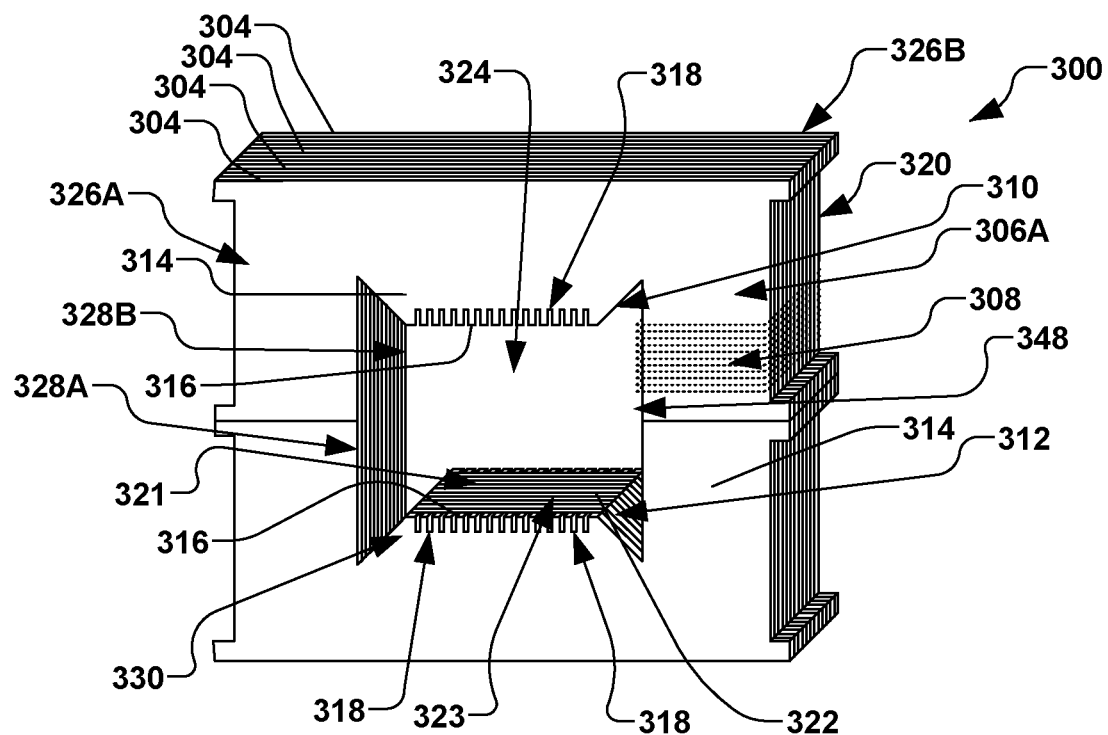
FIG. 5 is a perspective view of another exemplary yoke of a scanning magnet in accordance with various examples of the present disclosure.
Figure 6:
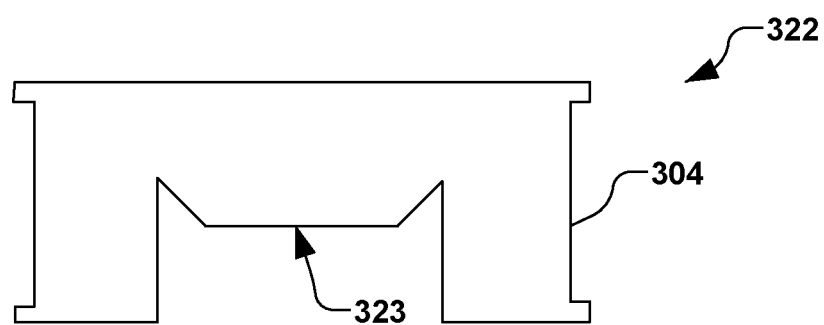
FIG. 6 is a plan view of a half of a planar lamination of a scanning magnet yoke in accordance with another exemplary aspect of the disclosure.

For example, FIG. 4 illustrates an exemplary lamination 304 comprising the slotted lamination 314. One or more of the plurality of laminations 304 associated with the respective pole edges 310 of the yoke 302 of FIG. 3, for example, may comprise the slotted lamination 314 of FIG. 4. In one example, all of the plurality of laminations 304 comprise slotted laminations 314, such as illustrated in FIG. 3. As an alternative configuration of the scanning magnet 300 of FIG. 3, FIG. 5 illustrates an example of the scanning magnet 300 having an alternative yoke 320, wherein any number of the plurality of laminations 304 associated with the pole edges 310 may comprise the slotted laminations 314 while the remaining of the plurality of laminations associated with a central portion 321 of the alternative yoke 320 respectively comprise a substantially planar lamination 322 as illustrated in FIG. 6, whereby the substantially planar lamination has a region 323 with no slots defined therein.

Accordingly, referring again to FIG. 3, the scanning magnet 300 for example, may be provided for magnetically scanning the ion beam 112 of FIG. 1, whereby the scanning magnet of FIG. 3 comprises the yoke 302 having a channel 324 defined therein. In the present example, the plurality of tines 316 extend inwardly toward the channel 324. The channel 324, for example, may be fully enclosed by the yoke 302 as shown in FIG. 3. Alternatively, the channel 324 may be substantially C-shaped or otherwise shaped (not shown) whereby the yoke does not fully enclose or the channel on all sides. It should be noted that any shape of the yoke 302 is contemplated as falling within the scope of the present disclosure. A first side 326A and a second side 326B of the yoke 302 of FIG. 3, for example, generally defines a respective entrance 328A and exit 328B for the ion beam 112 of FIG. 1, wherein the yoke comprises the plurality of laminations 304 that are generally stacked with respect to one another from the first side to the second side of the yoke.

In accordance with the present disclosure, the slotted lamination(s) 314 of FIG. 3, for example, are configured to generally prevent large induced currents, as discussed above. For example, the slotted lamination(s) 314 associated with the respective pole edges 310 generally reduces a length of a portion of the plurality of laminations 304 in a direction transverse to a flux associated with operation of the scanning magnet 300. For example, the bulk of the electric current flow is along the outer layers of the plurality of laminations 304, whereby the current flow decreases significantly at depths much in excess of the skin depth δ. The skin depth δ of each of the plurality of laminations 304 is the thickness within which eddy currents are formed, whereby the skin depth is inversely proportional to the square root of the operating frequency.

Figure 7C:
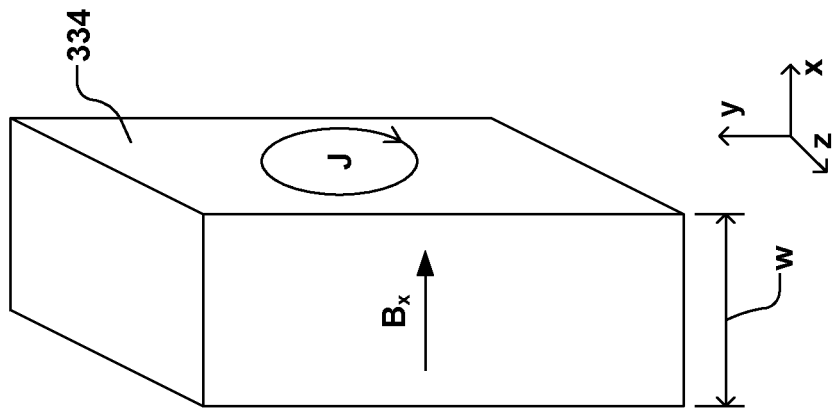
FIGS. 7A-7C are perspective views of various configurations of a lamination.
Figure 7B:
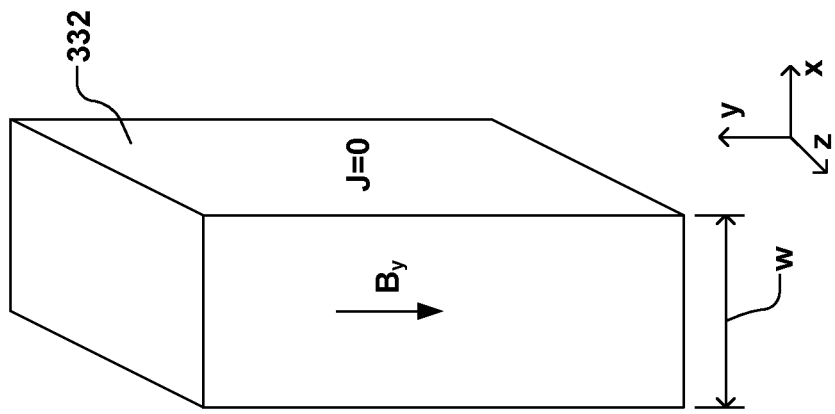
Figure 7A:
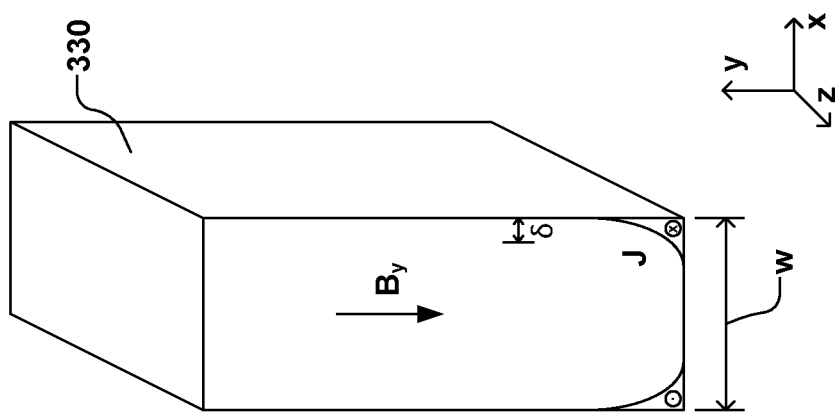

For a better understanding of current flow and losses associated with laminations, FIGS. 7A-7C are provided for background. As illustrated in FIG. 7A, a thick lamination 330 is provided having a lamination thickness W that is significantly greater than the skin depth δ. Such a thick lamination 330, for example, may experience circulating current J being shorted out by the main field $B_y$, thus resulting in no net flux through the lamination pole and may experience high losses. A very thin lamination 332 is shown in FIG. 7B, whereby the thickness W is significantly less than the skin depth δ. As such, the very thin lamination 332 may experience no flow of a circulating current (J=0), as the two currents on either side of the lamination cancel out. As such, flux may be guided through the lamination 304 with low losses. As illustrated in FIG. 7C in another lamination 334, in a transverse field $B_x$, circulating diamagnetic current flows, but with losses in the lamination 304.

Figure 8:
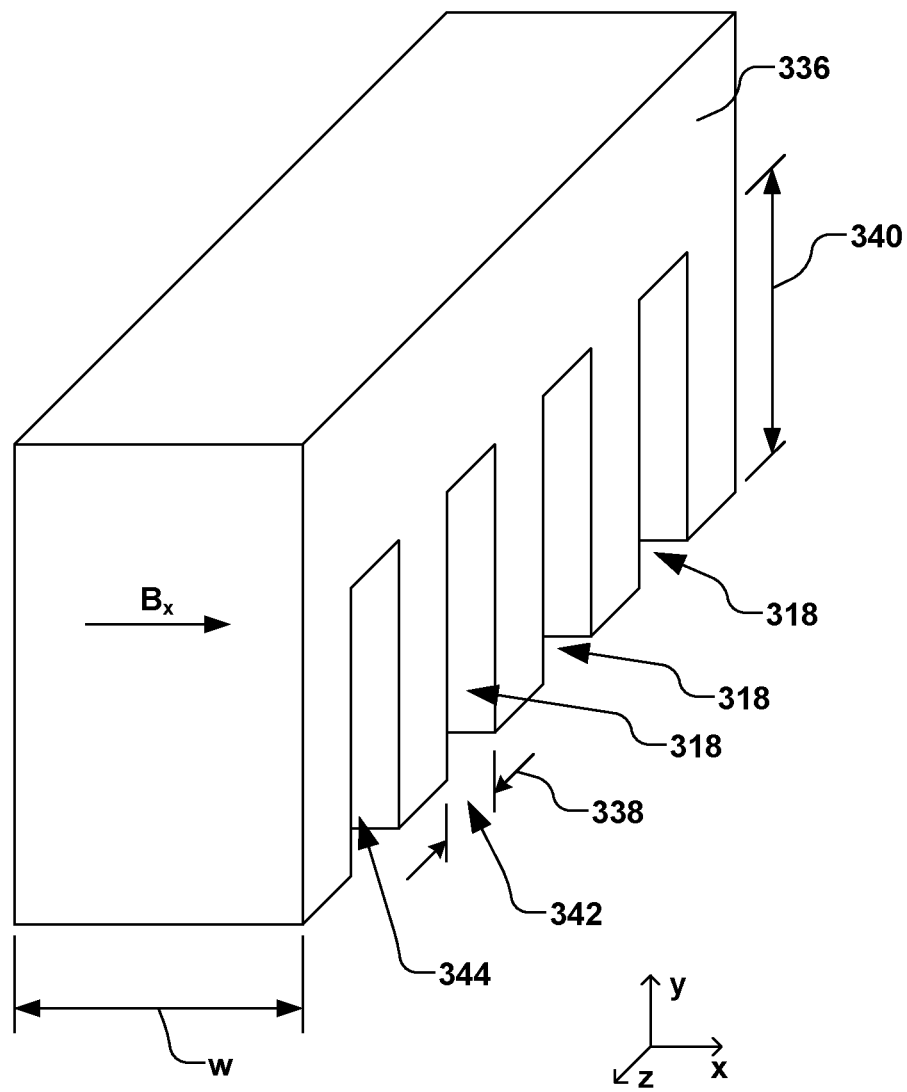
FIG. 8 is a perspective view of an exemplary lamination in accordance with an aspect of the present disclosure.

Thus, in accordance with the present disclosure, as illustrated in a simplified slotted lamination 336 of FIG. 8, the plurality of slots 318 are provided having a slot spacing 338 and a slot depth 340 configured to guide the flux 342 from the yoke 302 to a pole gap 344 (e.g., the region through which the ion beam passes, and in which the magnetic or scanning field is controlled) yet the plurality of slots are short enough to not cause excessive heating of the yoke. The plurality laminations 304 of FIGS. 3 and 4, for example, are slotted to resemble comb-like structures.

For example, the flux 342 is the integral of the field (which is also called flux density), whereby field lines leaving the pole can be interpreted as the flux. The slot spacing 338, for example, is related to the thickness W of the lamination 334. In one advantageous example, the slot spacing 338, for example, is of the order of the thickness W of lamination 334, whereby the slot 318 is as thick as insulation (e.g., approximately 0.1 mm—not shown) disposed between the plurality of laminations 304 of FIG. 3. However, in practice, it may be difficult to control the slot spacing 338 to such a small size (e.g., approximately 0.1 mm). Thus, an increase the slot spacing 338 of FIG. 8 can be accommodated by increasing the thickness W of the lamination 334 (e.g., steel) in order to maintain a generally constant fill factor (e.g., the ratio of steel to insulation) without increasing the reluctance of the pole edge and changing optical properties of the scanning magnet 300 of FIG. 3.

Figure 9:
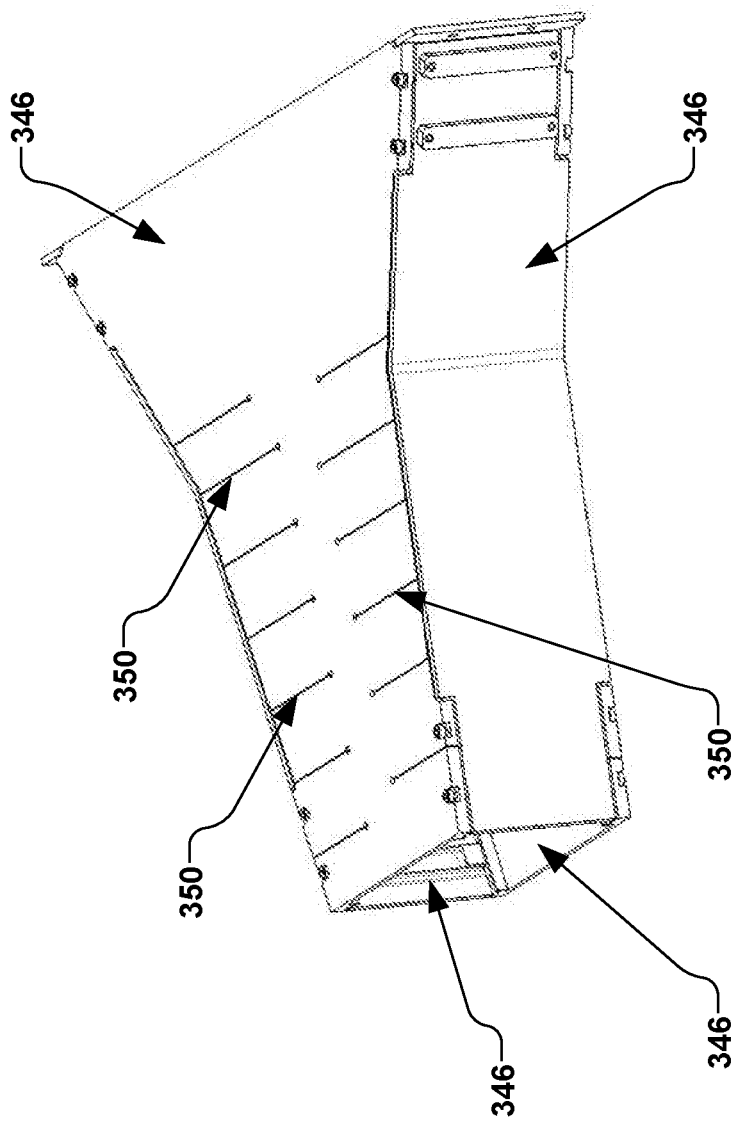
FIG. 9 is a perspective view of exemplary liners in accordance with another aspect of the present disclosure.

In yet another example, FIG. 9 illustrates one or more liners 346, wherein the one or more liners are configured to generally line an interior region 348 of the pole gap 344 of FIG. 3. The one or more liners 346, for example, are comprised of graphite, whereby the one or more liners generally protect the scanning magnet 122 of FIG. 1 from direct ion beam strike from the ion beam 112. In one example, the one or more of the one or more liners 346 further comprise one or more liner slots 350 defined therein. In one example, the one or more liner slots 350 are further configured to generally reduce eddy currents within the one or more liners 346, thus minimizing losses and diamagnetic effects.

It is further noted that the present disclosure further contemplates various dipole designs for ion implanters configured to reduce the length of the fringe fields by using a field clamp (not shown). Similar to that discussed above in regarding the scanning magnet 300, if the magnetic field enters the field clamp at an angle non-tangential to the surface of the field clamp lamination, the field clamp may be laminated and slotted to minimize losses, and all such implementations are contemplated as falling within the scope of the present disclosure.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A scanning magnet for magnetically scanning an ion beam, the scanning magnet comprising:
a yoke having a channel defined therein, the yoke having a first side and a second side defining a respective entrance and exit of the ion beam passing along a beam path through the channel, the yoke comprising a plurality of laminations stacked from the first side to the second side, and wherein at least a portion of the plurality of laminations associated with the first side and second side comprise one or more slotted laminations, wherein the one or more slotted laminations have a plurality of tines extending toward the channel, wherein a plurality of slots are defined between the plurality of tines;
one or more liners positioned within the channel, wherein the one or more liners are comprised of graphite and generally isolate the yoke and scanner coil from the ion beam, wherein the one or more liners further comprise one or more liner slots defined therein, wherein the one or more liner slots extend generally perpendicular to the beam path and are configured to generally reduce eddy currents within the one or more liners; and
a scanner coil comprising a first wire wrapped around the yoke.

2. The scanning magnet of claim 1, wherein the plurality of tines generally define a slot spacing and a slot depth associated with the plurality of slots, wherein the slot spacing and slot depth are configured to guide flux from the yoke via the plurality of tines toward a region through which the ion beam passes.

3. The scanning magnet of claim 2, wherein the slot spacing is approximately equal to a thickness one of the plurality of laminations.

4. The scanning magnet of claim 1, wherein the yoke comprises a first half and second half, wherein the first half and second half are generally mirror images of one another.

5. The scanning magnet of claim 1, wherein the at least a portion of the plurality of laminations comprising the plurality of slots are associated with one or more pole edges of the yoke.

6. The scanning magnet of claim 5, wherein a predetermined portion of the plurality of laminations associated with the pole edges comprise slotted laminations, and wherein a remainder of the plurality of laminations comprise a substantially planar lamination having a planar region associated with the plurality of slots, wherein the planar region comprises no slots.

7. The scanning magnet of claim 1, wherein the plurality of slots have a slot length configured to guide a flux from the yoke to a pole gap, whereby the slot length is configured to mitigate a heating of the yoke.

8. The scanning magnet of claim 1, wherein the plurality laminations generally define comb-like structures.

9. The scanning magnet of claim 1, wherein the one or more liner slots comprise a plurality of liner slots that are staggered with respect to one another when viewed along the beam path.

10. The scanning magnet of claim 9, wherein the one or more liners comprise at least a top liner extending along the beam path, wherein the plurality of liner slots respectively extend from opposing sides of the top liner toward a center of the top liner in an alternating manner.

11. The scanning magnet of claim 10, wherein the top liner is comprised of a contiguous graphite plate.

12. An ion implantation system, comprising:
an ion source configured to form an ion beam;
a mass analyzer; and a scanning magnet configured to magnetically scan the ion beam, wherein the scanning magnet comprises:
  a yoke having a channel defined therein, the yoke having a first side and a second side defining a respect entrance and exit of an ion beam passing along a beam path through the channel, the yoke comprising a plurality of laminations stacked from the first side to the second side, and wherein at least a portion of the plurality of laminations associated with the first side and second side comprise one or more slotted laminations, wherein the one or more slotted laminations have a plurality of tines extending toward the channel, wherein a plurality of slots are defined between the plurality of tines;
  one or more liners positioned within the channel, wherein the one or more liners are comprised of graphite and generally isolate the yoke and scanner coil from the ion beam, wherein the one or more liners further comprise one or more liner slots defined therein, wherein the one or more liner slots are extend generally perpendicular to the beam path and are configured to generally reduce eddy currents within the one or more liners; and
  a scanner coil comprising at least a first wire wrapped around the yoke.

13. The ion implantation system of claim 12, wherein the plurality of tines generally define a slot spacing and a slot depth associated with the plurality of slots, wherein the slot spacing and slot depth are configured to guide flux from the yoke via the plurality of tines toward a region through which the ion beam passes.

14. The ion implantation system of claim 13, wherein the slot spacing is approximately equal to a thickness one of the plurality of laminations.

15. The ion implantation system of claim 12, wherein the at least a portion of the plurality of laminations comprising the plurality of slots are associated with one or more pole edges of the yoke.

16. The ion implantation system of claim 15, wherein a predetermined portion of the plurality of laminations associated with the pole edges comprise slotted laminations, and wherein a remainder of the plurality of laminations comprise a substantially planar lamination having a planar region associated with the plurality of slots, wherein the planar region comprises no slots.

17. The ion implantation system of claim 12, wherein the plurality of slots have a slot length configured to guide a flux from the yoke to a pole gap, whereby the slot length is configured to mitigate a heating of the yoke.

18. The scanning magnet of claim 12, wherein the one or more liner slots comprise a plurality of liner slots that are staggered with respect to one another when viewed along the beam path.

19. The scanning magnet of claim 18, wherein the one or more liners comprise at least a top liner extending along the beam path, wherein the plurality of liner slots respectively extend from opposing sides of the top liner toward a center of the top liner in an alternating manner.

20. The scanning magnet of claim 19, wherein the top liner is comprised of a contiguous graphite plate.

* * * * *